US012641869B2

(12) United States Patent
Hamano

(10) Patent No.: US 12,641,869 B2
(45) Date of Patent: May 26, 2026

(54) AMPLIFIER CIRCUIT

(71) Applicant: SUMITOMO ELECTRIC INDUSTRIES, LTD., Osaka (JP)

(72) Inventor: Koshi Hamano, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 389 days.

(21) Appl. No.: 18/313,876

(22) Filed: May 8, 2023

(65) Prior Publication Data

US 2023/0402451 A1     Dec. 14, 2023

(30) Foreign Application Priority Data

Jun. 10, 2022    (JP) .................................. 2022-094128

(51) Int. Cl.

| | |
|---|---|
| *H01L 27/06* | (2006.01) |
| *H03F 3/195* | (2006.01) |
| *H10D 62/13* | (2025.01) |
| *H10D 64/27* | (2025.01) |
| *H10D 84/01* | (2025.01) |

(Continued)

(52) U.S. Cl.
CPC ........... *H10D 84/811* (2025.01); *H03F 3/195* (2013.01); *H10D 62/152* (2025.01); *H10D 62/156* (2025.01); *H10D 64/519* (2025.01); *H10D 84/01* (2025.01); *H10D 84/83* (2025.01)

(58) Field of Classification Search
CPC ...... H10D 84/811; H10D 84/01; H10D 84/83; H10D 64/519; H10D 62/152; H03F 3/195
USPC ........................................................ 257/379
See application file for complete search history.

(56) References Cited

U.S. PATENT DOCUMENTS

2004/0263256 A1* 12/2004 Ishikawa ................. H03F 3/195
                                                                        330/296
2009/0256210 A1* 10/2009 Matsushita .......... H10D 89/601
                                                                        257/E21.409

(Continued)

FOREIGN PATENT DOCUMENTS

| JP | 2020-195033 A | 12/2020 |
|----|---------------|---------|
| JP | 2023-180648 A | 12/2023 |

OTHER PUBLICATIONS

Costanzo, F., et al., "A Ka-band Doherty Power Amplifier using an innovative Stacked-FET Cell", Proceeding of 2019 1 15th Conference on Ph. D Research in Microelectronics and Electronics (PRIME), pp. 165-168, Jul. 15-18, 2019.

*Primary Examiner* — Dzung Tran
(74) *Attorney, Agent, or Firm* — Volpe Koenig

(57) ABSTRACT

An amplifier circuit includes a first FET including a first semiconductor layer, a first source electrode, a first gate electrode, a first drain electrode and a first source wall having at least a part thereof provided above the first semiconductor layer between the first gate electrode and the first drain electrode, and a second FET including a second semiconductor layer, a second source electrode, a second gate electrode, a second drain electrode and a second source wall having at least a part thereof provided above the second semiconductor layer between the second gate electrode and the second drain electrode, wherein a length of the second source wall in a direction in which the second source electrode and the second drain electrode are arranged is smaller than that of the first source wall in a direction in which the first source electrode and the first drain electrode are arranged.

18 Claims, 18 Drawing Sheets

(51) Int. Cl.
  *H10D 84/80*    (2025.01)
  *H10D 84/83*    (2025.01)

(56)       References Cited

U.S. PATENT DOCUMENTS

| | | | |
|---|---|---|---|
| 2012/0194276 A1* | 8/2012 | Fisher | H10D 30/475 |
| | | | 330/296 |
| 2013/0099284 A1* | 4/2013 | Tserng | H10D 30/4755 |
| | | | 257/E21.403 |
| 2018/0069508 A1* | 3/2018 | Seshita | H03F 1/223 |
| 2019/0097592 A1* | 3/2019 | Goktepeli | H03F 3/21 |
| 2023/0402451 A1 | 12/2023 | Hamano | |

* cited by examiner

AMPLIFIER CIRCUIT

CROSS REFERENCE TO RELATED APPLICATIONS

This application claims priority based on Japanese Patent Application No. 2022-094128 filed on Jun. 10, 2022, and the entire contents of the Japanese patent applications are incorporated herein by reference.

FIELD

The present disclosure relates to an amplifier circuit, for example, an amplifier circuit having a field effect transistor.

BACKGROUND

A high-frequency amplifier circuit is used for a base station of mobile communication. There is known an amplifier circuit in which a field effect transistor (FET) having a source ground and an FET having a gate ground are cascode-connected as the high frequency amplifier circuit (for example, Patent Document 1: Japanese Patent Application Laid-Open No. 2020-195033).

SUMMARY

An amplifier circuit according to the present disclosure includes a first FET including: a first semiconductor layer; a first source electrode provided on the first semiconductor layer and connected to a first reference potential in a high frequency manner; a first gate electrode provided on the first semiconductor layer and inputting a high frequency signal; a first drain electrode provided on the first semiconductor layer; and a first source wall having at least a part thereof provided above the first semiconductor layer between the first gate electrode and the first drain electrode; and a second FET including: a second semiconductor layer; a second source electrode provided on the second semiconductor layer and electrically connected to the first drain electrode; a second gate electrode provided on the second semiconductor layer and connected to a second reference potential in the high frequency manner; a second drain electrode provided on the second semiconductor layer and outputting a high frequency signal; and a second source wall having at least a part thereof provided above the second semiconductor layer between the second gate electrode and the second drain electrode; wherein a length of the second source wall in a direction in which the second source electrode and the second drain electrode are arranged is smaller than a length of the first source wall in a direction in which the first source electrode and the first drain electrode are arranged.

An amplifier circuit according to the present disclosure includes a first FET including: a first source connected to a first reference potential in a high frequency manner; a first gate inputting a high frequency signal; and a first drain; and a second FET including: a second source electrically connected to the first drain; a second gate connected to a second reference potential in the high frequency manner; and a second drain outputting a high frequency signal; wherein a drain source capacitance per unit gate width in the second FET is smaller than a drain source capacitance per unit gate width in the first FET.

DETAILED DESCRIPTION OF EMBODIMENTS

Figure 1:
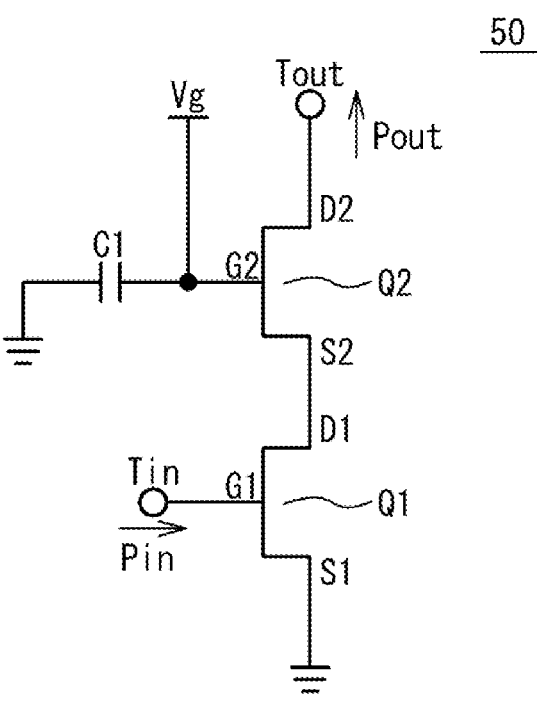
FIG. 1 is a circuit diagram illustrating an amplifier circuit according to a first embodiment.

In Patent Document 1, a gain is improved by using the cascode-connected amplifier circuit. However, a strain characteristic deteriorates.

The present disclosure has been made in view of the above problems, and an object of the present disclosure is to improve the strain characteristic.

DETAILS OF EMBODIMENTS OF THE PRESENT DISCLOSURE

First, the contents of the embodiments of this disclosure are listed and explained.

(1) An amplifier circuit according to the present disclosure includes a first FET including: a first semiconductor layer; a first source electrode provided on the first semiconductor layer and connected to a first reference potential in a high frequency manner; a first gate electrode provided on the first semiconductor layer and inputting a high frequency signal; a first drain electrode provided on the first semiconductor layer; and a first source wall having at least a part thereof provided above the first semiconductor layer between the first gate electrode and the first drain electrode; and a second FET including: a second semiconductor layer; a second source electrode provided on the second semiconductor layer and electrically connected to the first drain electrode; a second gate electrode provided on the second semiconductor layer and connected to a second reference potential in the high frequency manner; a second drain electrode provided on the second semiconductor layer and outputting a high frequency signal; and a second source wall having at least a part thereof provided above the second semiconductor layer between the second gate electrode and the second drain electrode; wherein a length of the second source wall in a direction in which the second source electrode and the second drain electrode are arranged is smaller than a length of the first source wall in a direction in which the first source electrode and the first drain electrode are arranged. Thereby, a distortion characteristic such as an AM-PM characteristic can be improved.

(2) In the above (1), a position of an end near the second source electrode in the second source wall with respect to the second gate electrode may be located closer to the second drain electrode than a position of an end near the first source electrode in the first source wall with respect to the first gate electrode.

(3) In the above (1) or (2), a position of an end near the second drain electrode in the second source wall with respect to the second gate electrode may be located closer to the second source electrode than a position of an end near the first drain electrode in the first source wall with respect to the first gate electrode.

(4) In any one of (1) to (3) above, at least a part of the second source wall may overlap with at least a part of the second gate electrode when viewed from a thickness direction of the second semiconductor layer.

(5) In any one of (1) to (4) above, the first source wall and the first source electrode may have a same potential as each other, and the second source wall and the second source electrode may have a same potential as each other.

(6) In any one of (1) to (5) above, the first semiconductor layer and the second semiconductor layer may be provided on a same substrate, and the first drain electrode and the second source electrode may be provided as a common electrode.

(7) An amplifier circuit according to the present disclosure includes a first FET including: a first source connected to a first reference potential in a high frequency manner; a first gate inputting a high frequency signal; and a first drain; and a second FET including: a second source electrically connected to the first drain; a second gate connected to a second reference potential in the high frequency manner; and a second drain outputting a high frequency signal; wherein a drain source capacitance per unit gate width in the second FET is smaller than a drain source capacitance per unit gate width in the first FET. Thereby, a distortion characteristic such as an AM-PM characteristic can be improved.

(8) In the above (7), a gate-drain capacitance per unit gate width in the second FET may be larger than a gate-drain capacitance per unit gate width in the first FET.

Specific examples of the amplifier circuit in accordance with embodiments of the present disclosure are described below with reference to the drawings. The present disclosure is not limited to these examples, but is indicated by the claims, which are intended to include all modifications within the meaning and scope of the claims.

First Embodiment

FIG. 1 is a circuit diagram illustrating an amplifier circuit according to a first embodiment. As illustrated in FIG. 1, an amplifier circuit 50 includes cascode-connected FETs Q1 and Q2. The FET Q1 is a source-grounded FET. The FET Q2 is a gate-grounded FET. A source S1 of the FET Q1 is connected to a ground (first reference potential) in a high-frequency manner. A gate G1 is connected to an input terminal Tin and receives a high-frequency signal of an input power Pin. A drain D1 is connected to a source S2 of the FET Q2. The source S2 of the FET Q2 is connected to the drain D1 of the FETQ1. A gate G2 is connected to a ground (second reference potential) via a capacitor C1. A drain D2 is connected to an output terminal, Tout, to which a high frequency signal of an output power, Pout, is output. Since the gate G2 is grounded via the capacitor C1, the gate G2 is grounded in a high-frequency manner. A gate bias voltage Vg of the FET Q2 is applied to the gate G2. An impedance matching circuit (not illustrated) and a bias circuit for supplying a gate bias voltage to the gate G1 are connected between the gate G1 and the input terminal Tin. An impedance matching circuit (not illustrated) and a bias circuit for supplying a drain bias voltage to the drain D2 are connected between the drain D2 and the output terminal Tout. The gate widths of the FETs Q1 and Q2 may be the same as each other or different from each other.

The FETs Q1 and Q2 are, for example, GaN HEMT (Gallium Nitride High Electron Mobility Transistor) or LDMOS (Laterally Diffused Metal Oxide Semiconductor). The FETs Q1 and Q2 may be GaAs-based FETs. The center frequency of the band of the amplifier circuit 50 is, for example, 0.5 GHz to 10 GHz and is used for a base station of mobile communication, for example.

Figure 2:
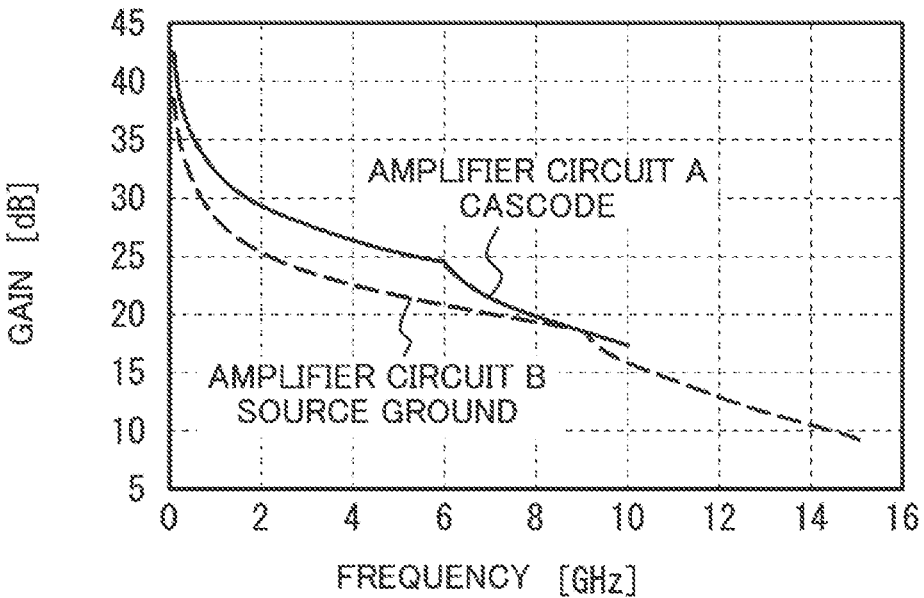
FIG. 2 is a circuit diagram illustrating gains with respect to a frequency in amplifier circuits A and B.

An example of the gains of an amplifier circuit A having a cascode-connected FET as in the first embodiment and an amplifier circuit B having only a source-grounded FET without providing a gate-grounded FET is illustrated. FIG. 2 is a circuit diagram illustrating gains with respect to a frequency in the amplifier circuits A and B. In FIG. 2, a horizontal axis represents a frequency and a vertical axis represents a gain. As illustrated in FIG. 2, the amplifier circuit A has a larger gain than the amplifier circuit B. The output power Pout of the amplifier circuit A can be larger than that of the amplifier circuit B.

In a high-frequency power amplifier, it is required to improve the AM (Amplitude Modulation)-PM (Phase Modulation) characteristic as one of the distortion characteristics. The AM-PM characteristic is a characteristic in which a phase difference between an input signal and an output signal changes as the input power (or output power) increases. Preferably, the phase does not change even if the input power is increased. The reduction of the AM-PM characteristic can be suppressed by reducing a reactance component of Y21 in a Y-parameter of the FET.

Figure 3:
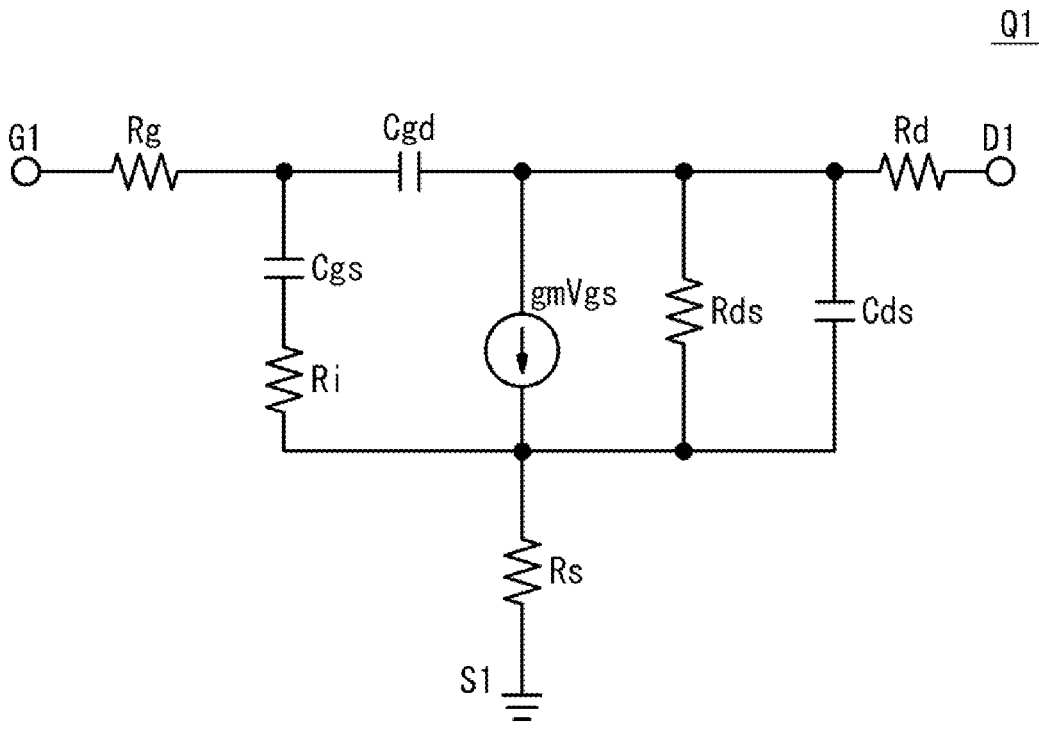
FIG. 3 is an equivalent circuit of a small signal model in a source-grounded FET.

FIG. 3 is an equivalent circuit of a small signal model in a source-grounded FET. As illustrated in FIG. 3, in the FET Q1, the source S1 is grounded, a high frequency signal is input to the gate G1, and a high frequency signal is output from the drain D1. A drain source current is represented by a current source gmVgs. A node near the source S1 of the current source gmVgs is connected to the source S1 via a source resistor Rs. A drain source resistance Rds and a drain source capacitance Cds are connected in parallel to the current source gmVgs. A node near the drain D1 of the current source gmVgs is connected to the drain D1 via a drain resistor Rd. A gate-drain capacitance Cgd and a gate resistor Rg are connected in series between the node near the drain D1 of the current source gmVgs and the gate G1. A gate-source capacitance Cgs and a channel resistance Ri are connected in series between a node between Cgd and Rg and the node between gmVgs and Rs. When the gate G1 is a port 1 and the drain D1 is a port 2, the Y21 of the Y-parameter is gm−jωCgd (i.e., Y21=gm−jωCgd). Therefore, in the source-grounded FET Q1, the AM-PM characteristic can be improved by reducing Cgd.

Figure 4:
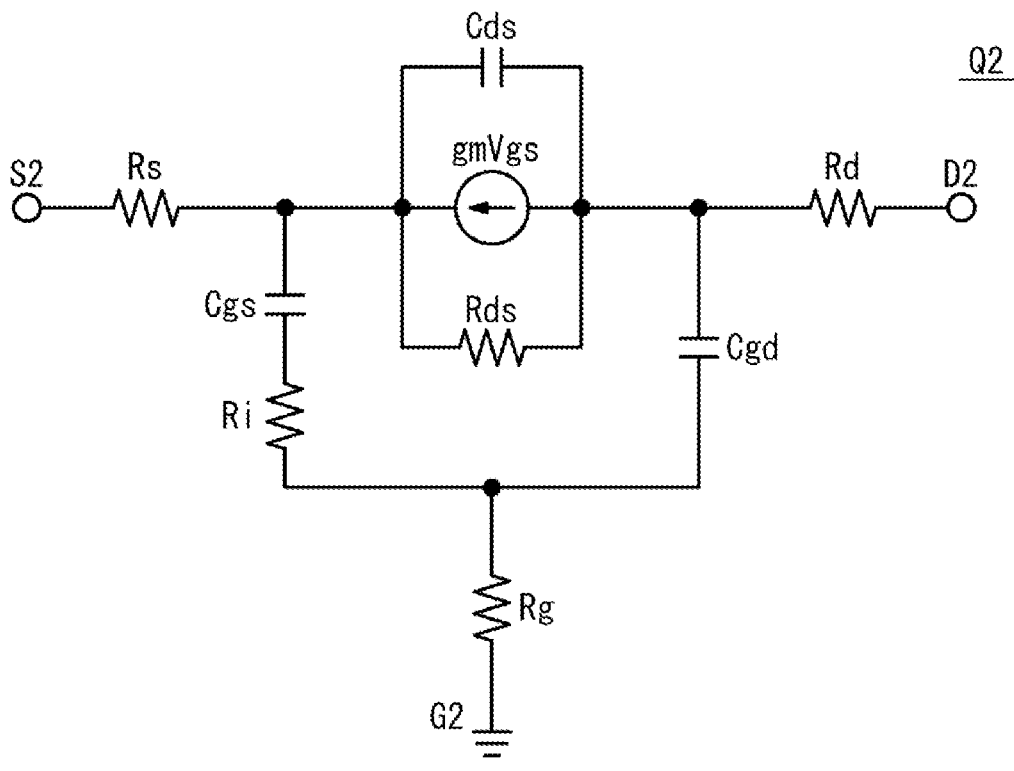
FIG. 4 is an equivalent circuit of a small signal model in a gate-grounded FET.

FIG. 4 is an equivalent circuit of a small signal model in a gate-grounded FET. As illustrated in FIG. 4, in the FET Q2, the gate G2 is grounded, the high-frequency signal is input to the source S2, and the high-frequency signal is output from the drain D2. When the source S2 is the port 1 and the drain D2 is the port 2, the Y21 of the Y-parameter is −gm−jωCds (i.e., Y21=−gm−jωCds). Therefore, in the gate-grounded FET Q2, the AM-PM characteristic can be improved by reducing Cds.

[Simulation 1]

In Simulation 1, the AM-PM characteristic of the gate-grounded FET Q2 alone was simulated. The gate G2 of the FET Q2 is grounded, the high-frequency signal is input to the source S2 as the input signal, and the high frequency signal is output from the drain D2 as the output signal. The input power of the input signal is represented as Pin, and the phase difference between the phases of the output signal and the input signal is represented as a phase. Capacitances Cds2, Cgs2 and Cgd2 in the FET Q2 were set as follows. First, capacitances Cds1, Cgs1 and Cgd1 of the source-grounded FET Q1 were set so as to improve the AM-PM characteristic of the source-grounded FET Q1 alone. The values of the capacitances Cds2, Cgd2 and Cgs2 of the gate-grounded FET Q2 were set based on the values of the capacitances Cds1, Cgd1 and Cgs1 of the FET Q1. The FETs Q1 and Q2 are GaN HEMTs. The gate widths of the FETs Q1 and Q2 are the same as each other.

Figure 5:
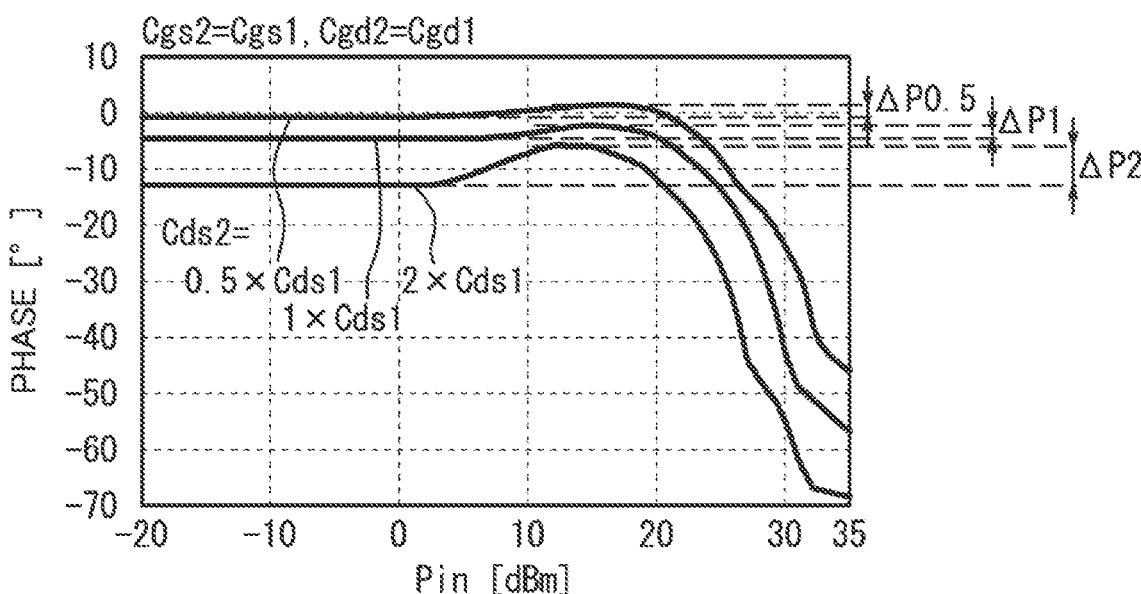
FIG. 5 is a diagram illustrating a phase with respect to an input power Pin when a drain source capacitance Cds2 of an FET Q2 is changed in a simulation 1.

Simulation was carried out when the Cgs2 and Cgd2 of the FET Q2 were set to the Cgs1 and Cgd1, respectively, and the Cds2 was set to 0.5×Cds1, 1×Cds1 and 2×Cds1. FIG. 5 is a diagram illustrating a phase with respect to the input power Pin when the drain source capacitance Cds2 of an FET Q2 is changed in a simulation 1. A horizontal axis represents the input power Pin input to the input terminal Tin, and a vertical axis represents the phase difference between the high-frequency signal input to the input terminal Tin and the signal output from the output terminal Tout. As illustrated in FIG. 5, when the Cds2 is 0.5×Cds1, the phase is substantially constant up to 5 dBm even if the Pin increases from −20 dBm. When the Pin is 15 to 20 dBm, the phase increases, and when the Pin is further increased, the phase rapidly decreases. A difference ΔP0.5 between a phase when Pin is small and a phase at a phase-peak time is about 2°. When the Cds2 is 1×Cds1, a difference ΔP1 between the phase when the Pin is small and the phase at the phase-peak time is about 4°. When the Cds2 is 2×Cds1, a difference ΔP2 between the phase when the Pin is small and the phase at the phase-peak time is about 8°. Thus, in the gate-grounded FET Q2, when the Cds2 is smaller than the Cds1 optimized in the source-grounded FET Q1, the ΔP becomes smaller.

Figure 6:
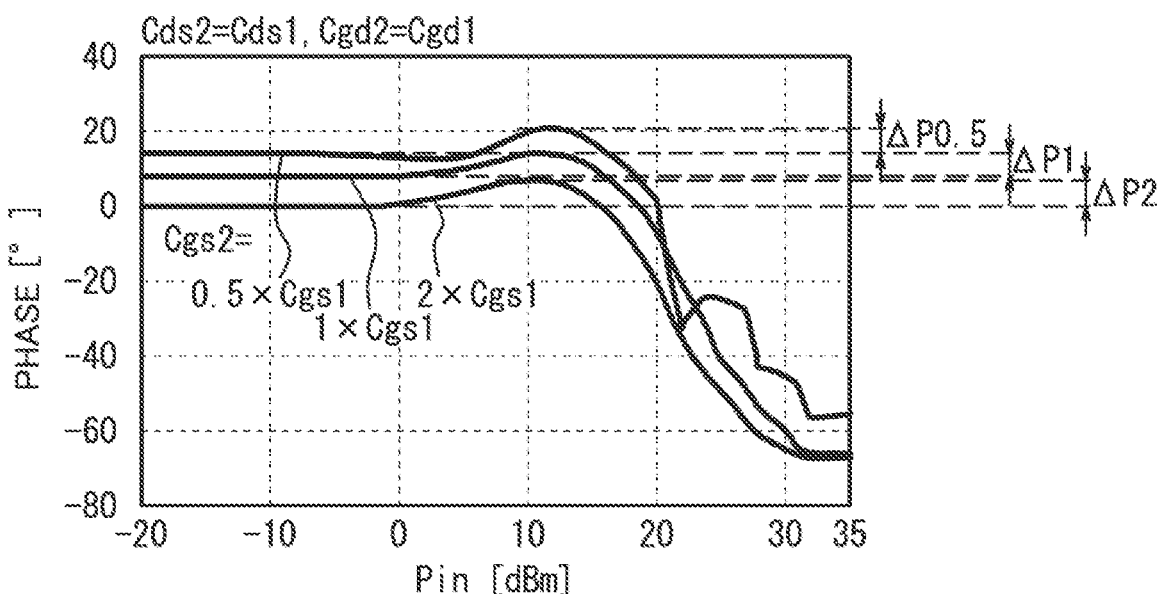
FIG. 6 is a diagram illustrating a phase with respect to an input power Pin when a gate-source capacitance Cgs2 of the FETQ2 is changed in the simulation 1.

Simulation was carried out when the Cds2 and the Cgd2 of the FET Q2 were set to the Cds1 and the Cgd1, respectively, and the Cgs2 was set to 0.5×Cgs1, 1×Cgs1, and 2×Cgs1. FIG. 6 is a diagram illustrating a phase with respect to the input power Pin when the gate-source capacitance Cgs2 of the FETQ2 is changed in the simulation 1. As illustrated in FIG. 6, each of the ΔP0.5, the ΔP1 and the ΔP2 is 7 to 8°. As described above, in the gate-grounded FET Q2, the ΔP hardly changes even if the Cgs2 is changed.

Figure 7:
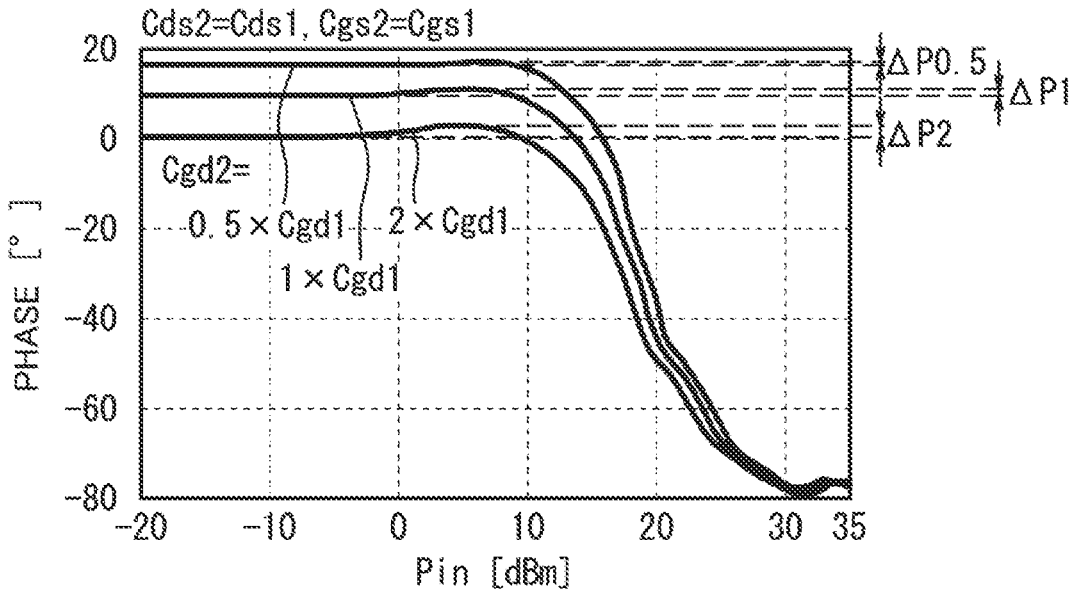
FIG. 7 is a diagram illustrating a phase with respect to an input power Pin when a gate-drain capacitance Cgd2 of the FET Q2 is changed in the simulation 1.

Simulation was performed when the Cds2 and the Cgs2 of the FET Q2 were set to the Cds1 and the Cgs1, respectively, and the Cgd2 was set to 0.5×Cgd1, 1×Cgd1 and 2×Cgd1. FIG. 7 is a diagram illustrating a phase with respect to the input power Pin when the gate-drain capacitance Cgd2 of the FET Q2 is changed in the simulation 1. As illustrated in FIG. 7, each of the ΔP0.5, the ΔP1 and the ΔP2 is 2 to 3°. As described above, in the gate-grounded FET Q2, the ΔP hardly changes even if the Cgd2 is changed.

As described above, in the gate-grounded FET Q2, the ΔP becomes smaller when the Cds2 becomes smaller. That is, the AM-PM characteristic is improved. The AM-PM characteristic is almost independent of the Cgs and the Cgd. This is because, as explained with reference to FIG. 4, in the gate-grounded FET Q2, the reactance component of Y21 is mainly the Cds. As described with reference to FIG. 3, in the source-grounded FET Q1, the reactance component of Y21 is mainly the Cgd. Therefore, in the source-grounded FET Q1, the AM-PM characteristic is improved when the Cgd is reduced, and the AM-PM characteristic hardly depends on the Cds and the Cgs.

[Simulation 2]

Figure 8:
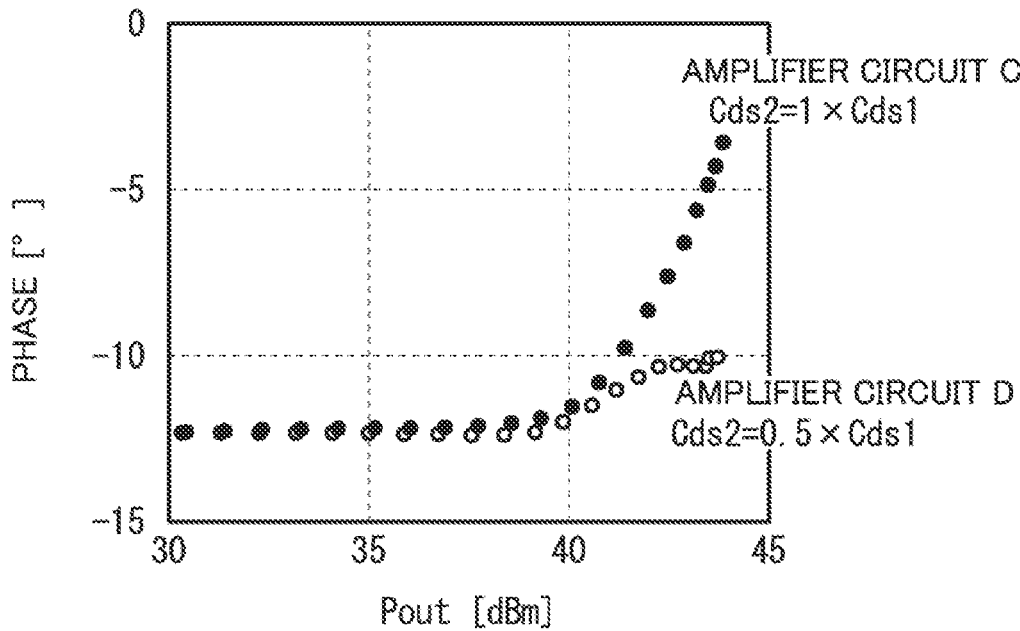
FIG. 8 is a diagram illustrating phases with respect to an output power Pout in amplifier circuits C and D in a simulation 2.

In the simulation 2, the AM-PM characteristic of the amplifier circuit 50 having the FETs Q1 and Q2 was simulated. The Cgs2 and the Cgd2 of the FET Q2 were set to the same values as the Cgs1 and the Cgd1 of the FET Q1, respectively. In an amplifier circuit C, the Cds2 of the FET Q2 is set to 1×Cds1. In an amplifier circuit D, the Cds2 of the FET Q2 is set to 0.5×Cds1. The phases with respect to the output power Pout (phase difference between the input signal and the output signal) in the amplifier circuits C and D were simulated. FIG. 8 is a diagram illustrating the phases with respect to the output power Pout in amplifier circuits C and D in the simulation 2. As illustrated in FIG. 8, the phases of both amplifier circuits C and D are substantially constant when the Pout is 40 dB or less. In the amplifier circuit C, the phase rapidly changes when Pout is 40 dBm or more, and an amount of change in the phase is about 10°. In the amplifier circuit D, the phase does not change greatly even if the Pout is 40 dBm or more, and the amount of change in the phase is about 2°. Thus, by making the Cds2 of the FET Q2 smaller than the Cds1 of the FET Q1, the AM-PM characteristic of the amplifier circuit can be improved.

According to the first embodiment, the FET Q1 (first FET) includes the source S1 (first source) connected to the ground (first reference potential) in the high-frequency manner, the gate G1 (first gate) to which the high-frequency signal is input, and the drain D1 (first drain). The FET Q2 (second FET) includes the source S2 (second source) connected to the drain D1, the gate G2 (second gate) connected to the ground (second reference potential) in a high-frequency manner, and a drain (D2) (second drain) which outputs the amplified high-frequency signal. The term "connection in the high frequency manner" means connection at a frequency of the band of the amplifier circuit 50. In the cascode amplifier circuit 50 having the FETs Q1 and Q2, the drain source capacitance Cds2 per unit gate width Wg in the FET Q2 is smaller than the drain source capacitance Cds1 per unit gate width Wg in the FET Q1. Thus, as illustrated in FIG. 5, the AM-PM characteristic of the FET Q2 can be improved. Therefore, as illustrated in FIG. 8, the AM-PM characteristic of the amplifier circuit 50 can be improved.

In order to improve the AM-PM characteristic of the FET Q2, the Cds2 per unit gate width Wg in the FET Q2 is preferably 0.9 times or less, more preferably 0.8 times or less, and even more preferably 0.6 times or less of the Cds1 per unit gate width Wg in the FET Q1. An FET with the small Cds2 is hard to realize. Therefore, the Cds2 per unit gate width Wg is preferably 0.1 times or more and more preferably 0.2 times or more of the Cds1 per unit gate width Wg.

The gate-drain capacitance Cgd2 per unit gate width Wg in the FET Q2 is larger than the gate-drain capacitance Cgd1 per unit gate width Wg in the FET Q1. Thus, the AM-PM characteristic of the FET Q1 can be improved. Therefore, the AM-PM characteristic of the amplifier circuit 50 can be improved. In order to improve the AM-PM characteristics of the FET Q1, the Cgd1 per unit gate width Wg in the FET Q1 is preferably 0.9 times or less, more preferably 0.8 times or less, and even more preferably 0.6 times or less of the Cgd2 per unit gate width Wg in the FET Q2. An FET with the small Cgd1 is hard to realize. Therefore, the Cgd1 per unit gate width Wg is preferably 0.1 times or more, and more preferably 0.2 times or more of Cgd2 per unit gate width Wg.

Second Embodiment

Figure 9:
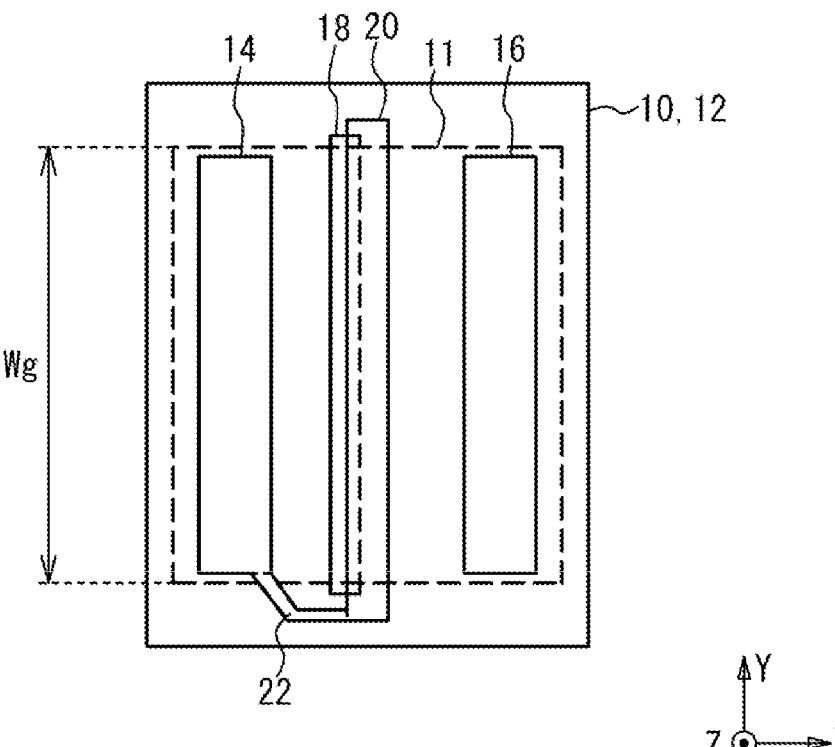
FIG. 9 is a plan view of an FET used according to a second embodiment.
Figure 10:
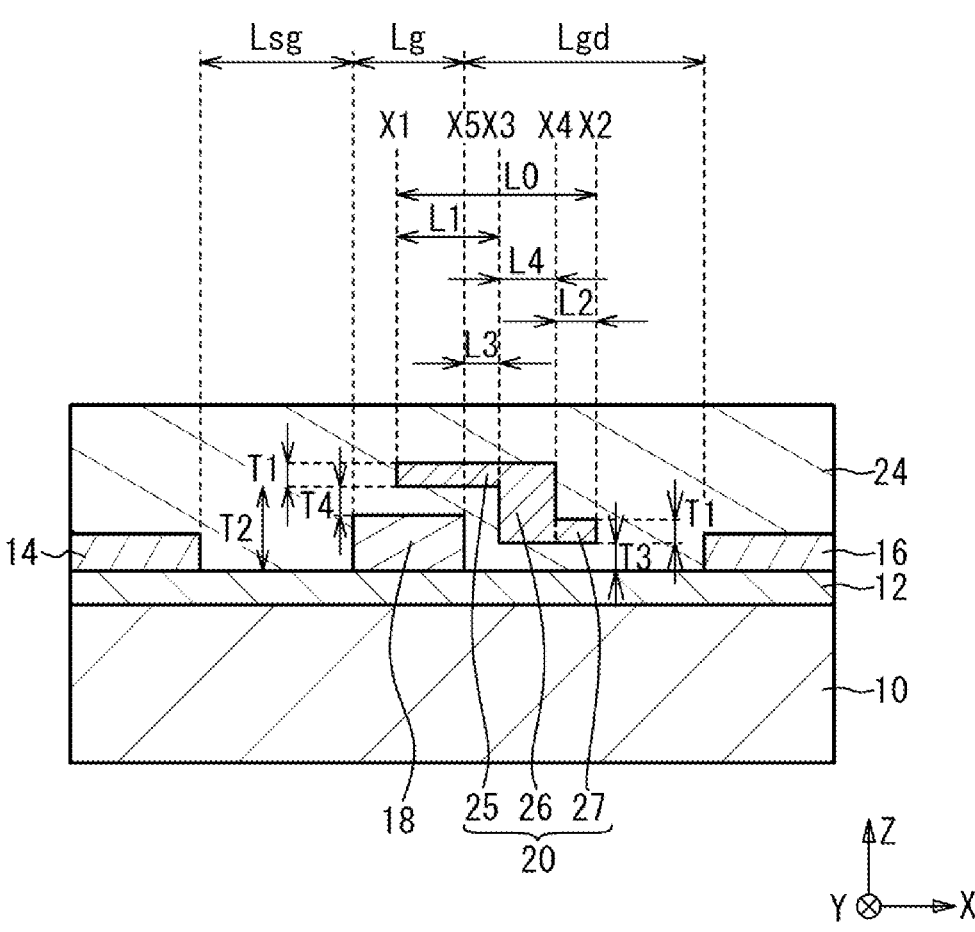
FIG. 10 is a cross-sectional view of the FET used according to the second embodiment.

FIG. 9 is a plan view of an FET used according to a second embodiment. FIG. 10 is a cross-sectional view of the FET used according to the second embodiment. A normal direction of a substrate 10 is a Z-direction, a direction from a source electrode 14 to a drain electrode 16 is an X-direction, and an extending direction of the source electrode 14, the drain electrode 16, and a gate electrode 18 is a Y-direction.

As illustrated in FIGS. 9 and 10, a semiconductor layer 12 is provided on the substrate 10. In the case of the GaN HEMT, the substrate 10 is, for example, a SiC substrate, a sapphire substrate, or a GaN substrate. The semiconductor layer 12 includes, for example, a GaN channel layer and an AlGaN barrier layer stacked on the substrate 10 in this order. A region in which the semiconductor layer 12 is inactivated by ion implantation or the like is an inactive region, and a region in which the semiconductor layer 12 is not inactivated is an active region 11. The source electrode 14, the drain electrode 16 and the gate electrode 18 are provided on the active region 11 of the semiconductor layer 12. In the X-direction, the source electrode 14 and the drain electrode 16 sandwich the gate electrode 18. Each of the source electrode 14 and the drain electrode 16 is a metal layer which includes a titanium layer and an aluminum layer stacked on the semiconductor layer 12 in this order, for example. The gate electrode 18 is a metal layer, which includes a nickel layer and a gold layer stacked on the semiconductor layer 12 in this order, for example. An insulating film 24 is provided on the semiconductor layer 12 so as to cover the source electrode 14, the drain electrode 16 and the gate electrode 18. The insulating film 24 is, for example, a silicon nitride film.

A source wall 20 is provided in the insulating film 24. The source wall 20 includes a top portion 25, a wall portion 26 and a bottom portion 27. Upper and lower surfaces of the top portion 25 and the bottom portion 27 are substantially parallel to an XY plane. The lower surface of the top portion 25 is located above the gate electrode 18 (i.e., on a positive side in the Z-direction). The lower surface of the bottom portion 27 is located below (i.e., on a negative side in the Z-direction) the upper surface of the gate electrode 18. The wall portion 26 is located between the gate electrode 18 and the drain electrode 16, the top portion 25 is connected to an upper portion of a −X side surface of the wall portion 26, and the bottom portion 27 is connected to a lower portion of a +X side surface of the wall portion 26. The source wall 20 and the source electrode 14 are electrically connected and short-circuited by a connection wiring 22. Thus, the potentials of the source electrode 14 and the source wall 20 are substantially the same as each other. The potential of the source wall 20 may be a potential other than that of the source electrode 14. Each of the source wall 20 and the connection wiring 22 is a metal layer, for example, a gold layer.

A gate-drain breakdown voltage can be improved by positioning at least a part of the source wall 20 above the semiconductor layer 12 between the gate electrode 18 and the drain electrode 16. Further, the Cgd can be reduced. In a plan view, at least part of the top portion 25 overlaps with at least part of the gate electrode 18, so that the Cgd can be further suppressed. In the plan view, the top portion 25 and the gate electrode 18 need not overlap each other.

A distance between the source electrode 14 and the gate electrode 18 is a source-gate distance Lsg, a distance between the gate electrode 18 and the drain electrode 16 is a gate-drain distance Lgd, and a length of the gate electrode 18 in the X-direction is a gate length Lg. A width of the active region 11 in the Y-direction is the gate width Wg. A thickness of each of the top portion 25 and the bottom portion 27 is T1, a height from the upper surface of the semiconductor layer 12 to the lower surface of the top portion 25 is T2, a height from the upper surface of the semiconductor layer 12 to the lower surface of the bottom portion 27 is T3, and a height from the upper surface of the gate electrode 18 to the lower surface of the top portion 25 is T4. A position of a −X end of the top portion 25 is X1, a position of a +X end of the bottom portion 27 is X2, a position of a −X side surface of the wall portion 26 is X3, a position of a +X side surface of the wall portion 26 is X4, and a position of the +X side surface of the gate electrode 18 is X5. A length of the source wall 20 in the X-direction is L0. A length of the top portion 25 in the X-direction is L1, a length of the bottom portion 27 in the X-direction is L2, a distance between the gate electrode 18 and the wall portion 26 in the X-direction is L3, and a length of the wall portion 26 in the X-direction is L4.

[Simulation 3]

The Cds, the Cgs and the Cgd were simulated by changing the lengths L1 and L2 and the distance L3. The basic simulation conditions are as follows.

Lsg=0.95 μm, Lgd=3.15 μm, Lg=0.5 μm, Wg=1.26 μm, T1=0.2 μm, T2=0.6 μm, T3=0.2 μm, T4=0.2 μm, L1=0.75 μm, L2=0.35 μm, L3=0.5 μm, L4=0.5 μm

Insulating film 24: silicon nitride film

Figure 11A:
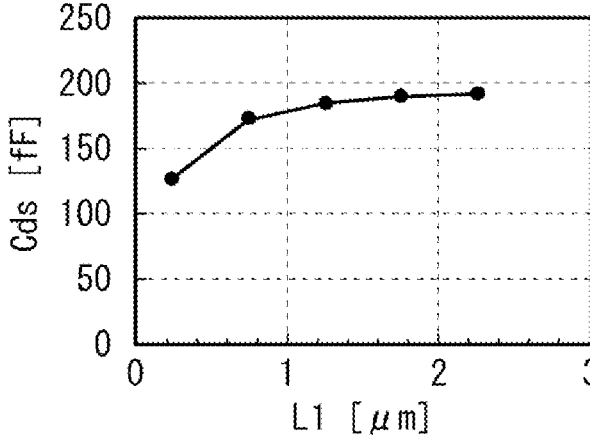
FIGS. 11A to 11C are diagrams illustrating a drain source capacitance Cds, a gate-drain capacitance Cgd, and a gate-source capacitance Cgs with respect to a length L1 in a simulation 3, respectively.
Figure 11B:
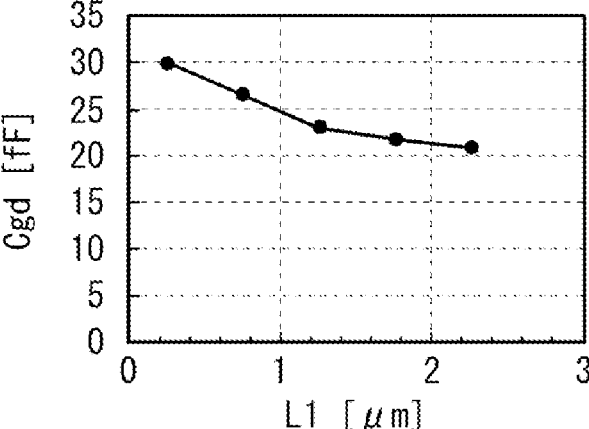
Figure 11C:
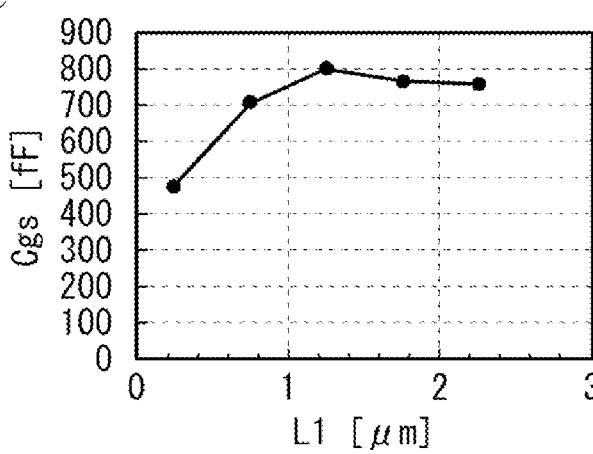

FIGS. 11A to 11C are diagrams illustrating the Cds, the Cgd, and the Cgs with respect to the L1 in a simulation 3, respectively. The dimensions other than the L1 are the above dimensions. As illustrated in FIGS. 11A to 11C, as the L1 becomes longer, the Cds becomes larger, the Cgd becomes smaller, and the Cgs becomes larger. Therefore, in the FET Q1, the Cgd can be reduced by lengthening the L1, and in the FETQ2, the Cds can be reduced by shortening the L1. Thereby, the AM-PM characteristic can be improved.

Figure 12A:
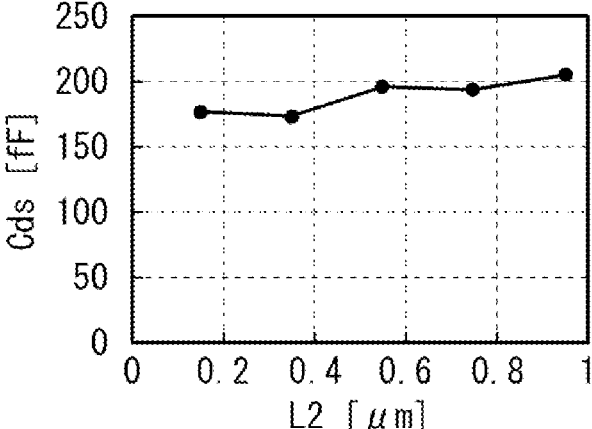
FIGS. 12A to 12C are diagrams illustrating a drain source capacitance Cds, a gate-drain capacitance Cgd, and a gate-source capacitance Cgs with respect to a length L2 in the simulation 3, respectively.
Figure 12B:
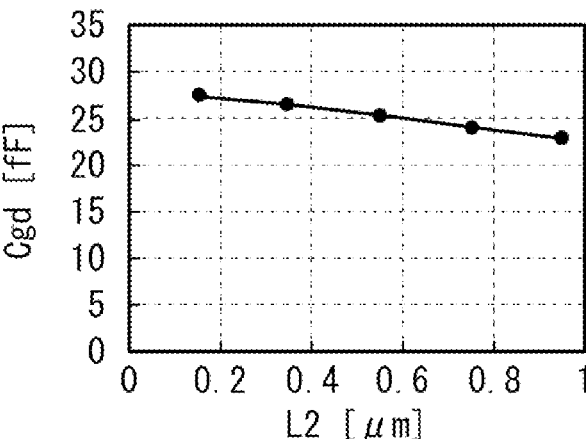
Figure 12C:
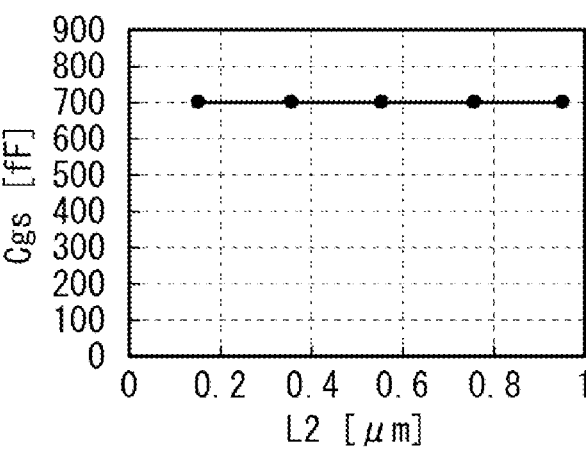

FIGS. 12A to 12C are diagrams illustrating the Cds, the Cgd, and the Cgs with respect to the L2 in the simulation 3, respectively. The dimensions other than the L2 are the above dimensions. As illustrated in FIGS. 12A to 12C, as the L2 becomes longer, the Cds becomes larger, the Cgd becomes smaller, and the Cgs remains almost unchanged. Therefore, the AM-PM characteristic can be improved by lengthening the L2 in the FET Q1 and shortening the L1 in the FET Q2.

Figure 13A:
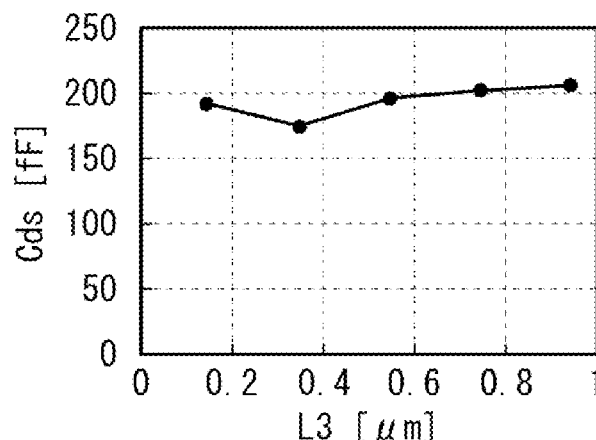
FIGS. 13A to 13C are diagrams illustrating a drain source capacitance Cds, a gate-drain capacitance Cgd, and a gate-source capacitance Cgs with respect to a length L3 in the simulation 3, respectively.
Figure 13B:
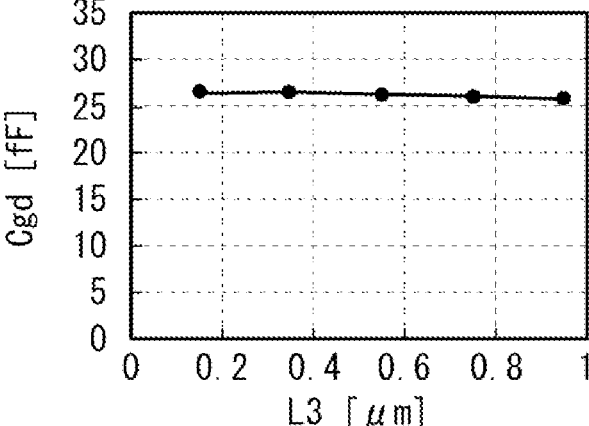
Figure 13C:
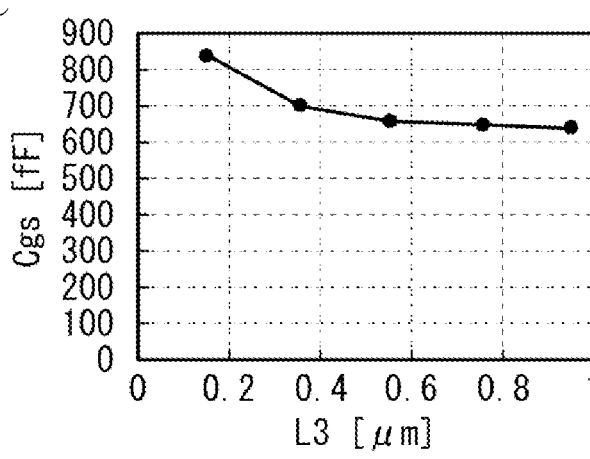

FIGS. 13A to 13C are diagrams illustrating the Cds, the Cgd, and the Cgs with respect to the L3 in the simulation 3, respectively. When the position X1 of the end of the top portion 25 is not moved, and the L3 becomes longer, the L1 becomes longer. The L2 and the L4 are left unchanged. A distance between the positions X3 and X1 is set to 0.75 μm. The dimensions other than L1 and L3 are those described above. As illustrated in FIGS. 13A to 13C, as the L3 becomes longer, the Cds becomes larger, and the Cgd and the Cgs become smaller. Therefore, the AM-PM characteristic can be improved by lengthening the L3 in the FET Q1 and shortening the L3 in the FET Q2.

Figure 14A:
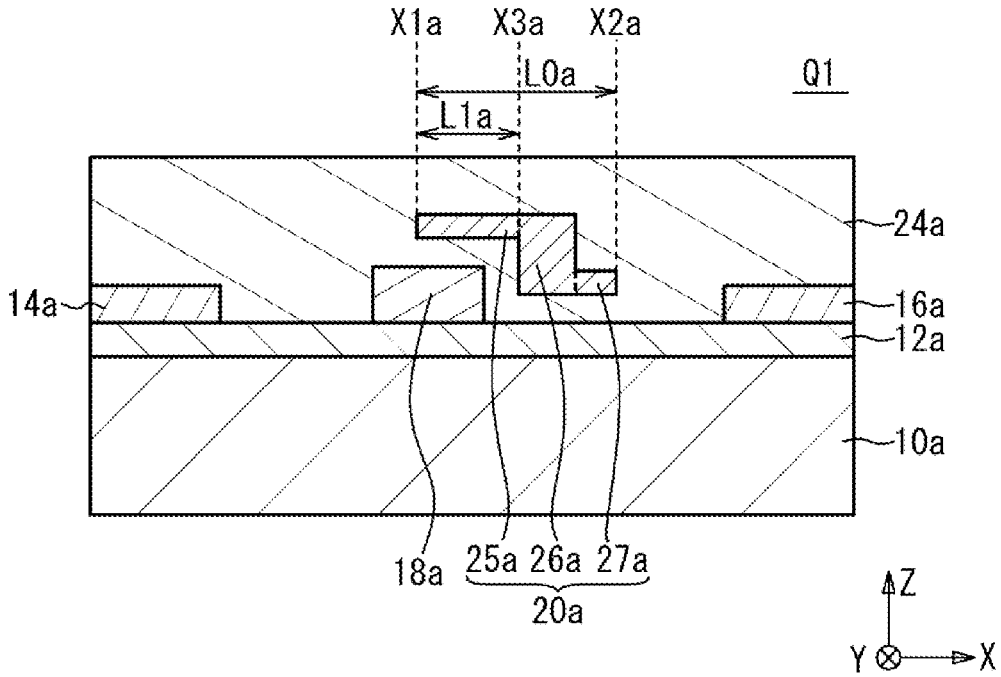
FIGS. 14A and 14B are cross-sectional views of FETs Q1 and Q2 according to the second embodiment, respectively.
Figure 14B:
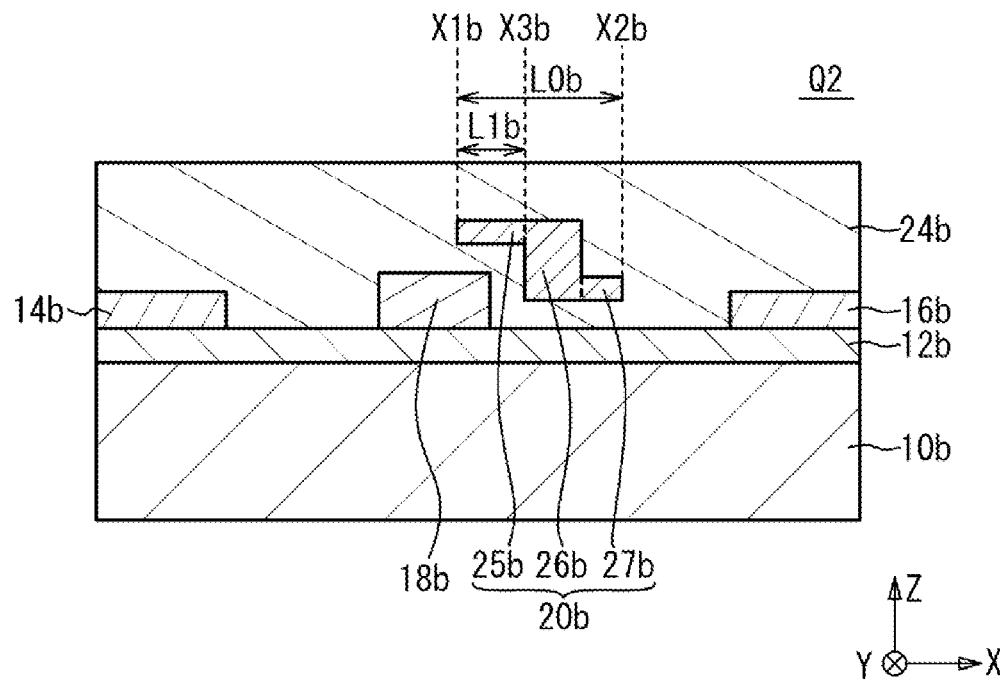

FIGS. 14A and 14B are cross-sectional views of the FETs Q1 and Q2 according to the second embodiment, respectively. As illustrated in FIGS. 14A and 14B, in the FET Q1, a semiconductor layer 12a is provided on a substrate 10a, and a source electrode 14a, a drain electrode 16a, and a gate electrode 18a are provided on the semiconductor layer 12a. An insulating film 24a is provided on the semiconductor layer 12a so as to cover the source electrode 14a, the drain electrode 16a, and the gate electrode 18a. A source wall 20a is provided in the insulating film 24a. The source wall 20a includes a top portion 25a, a wall portion 26a and a bottom portion 27a. In the FET Q2, a semiconductor layer 12b is provided on a substrate 10b, and a source electrode 14b, a drain electrode 16b and a gate electrode 18b are provided on the semiconductor layer 12b. An insulating film 24b is provided on the semiconductor layer 12b so as to cover the source electrode 14b, the drain electrode 16b, and the gate electrode 18b. A source wall 20b is provided in the insulating film 24b. The source wall 20b includes a top portion 25b, a wall portion 26b, and a bottom portion 27b. Other configurations of the FETs Q1 and Q2 are the same as those of FIGS. 9 and 10, and the description thereof is omitted. A circuit diagram of the amplifier circuit is the same as the circuit diagram illustrated in FIG. 1 of the first embodiment, and the description thereof is omitted.

A length L1b of the top portion 25b of the FET Q2 is smaller than a length L1a of the top portion 25a in the FET Q1. Therefore, a length L0b of the source wall 20b in the FET Q2 is smaller than a length L0a of the source wall 20a in the FET Q1. Thus, as illustrated in FIGS. 11A and 11B, the Cds2 of the FET Q2 becomes smaller than the Cds1 of the FET Q1. The Cgd1 of the FET Q1 becomes smaller than the Cgd2 of the FET Q2. Therefore, the AM-PM characteristic of the amplifier circuit can be improved.

First Variation of Second Embodiment

Figure 15A:
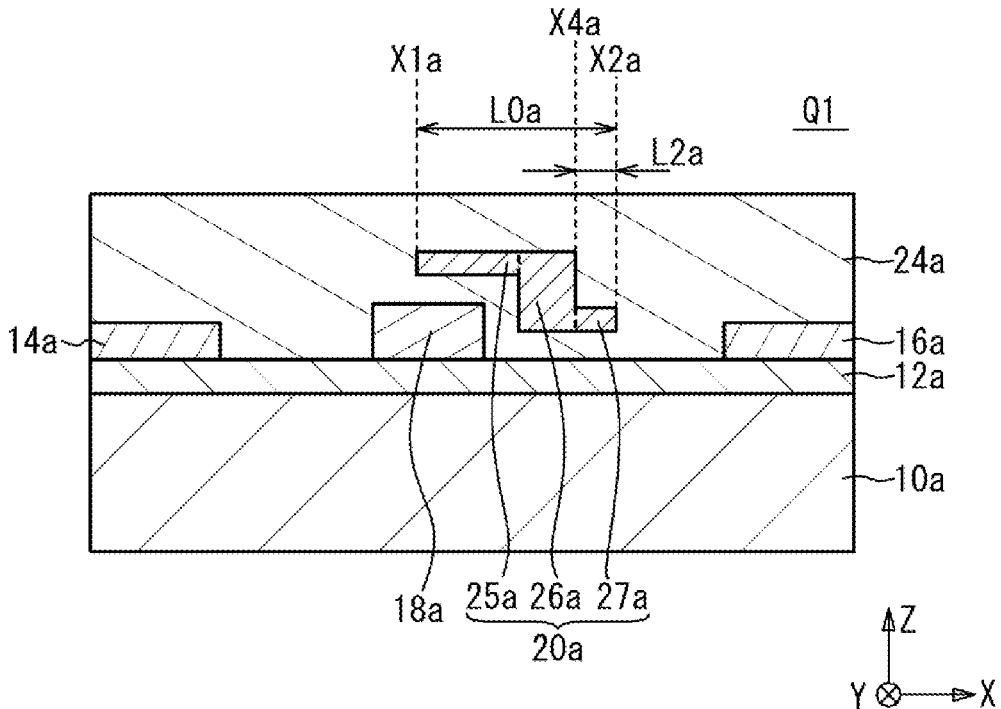
FIGS. 15A and 15B are cross-sectional views of FETs Q1 and Q2 according to a first variation of the second embodiment, respectively.
Figure 15B:
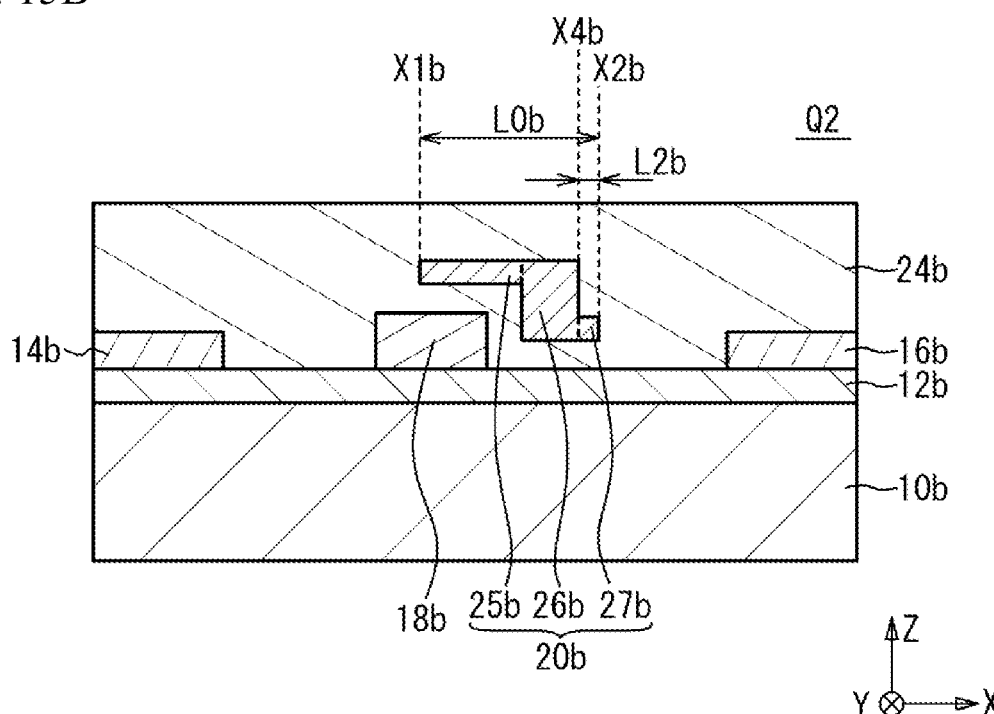

FIGS. 15A and 15B are cross-sectional views of the FETs Q1 and Q2 according to a first variation of the second embodiment, respectively. As shown in FIGS. 15A and 15B, a length L2b of the bottom portion 27b in the FET Q2 is smaller than a length L2a of the bottom portion 27a in the FET Q1. Therefore, the length L0b of the source wall 20b in the FET Q2 is smaller than the length L0a of the source wall 20a in the FET Q1. Other configurations are the same as those of FIGS. 14A and 14B of the second embodiment, and the description thereof is omitted. In the first variation of the second embodiment, as illustrated in FIGS. 12A and 12B, the Cds2 of the FET Q2 becomes smaller than the Cds1 of the FET Q1. The Cgd1 of the FET Q1 becomes smaller than the Cgd2 of the FETQ2. Therefore, the AM-PM characteristic of the amplifier circuit can be improved.

Second Variation of Second Embodiment

Figure 16A:
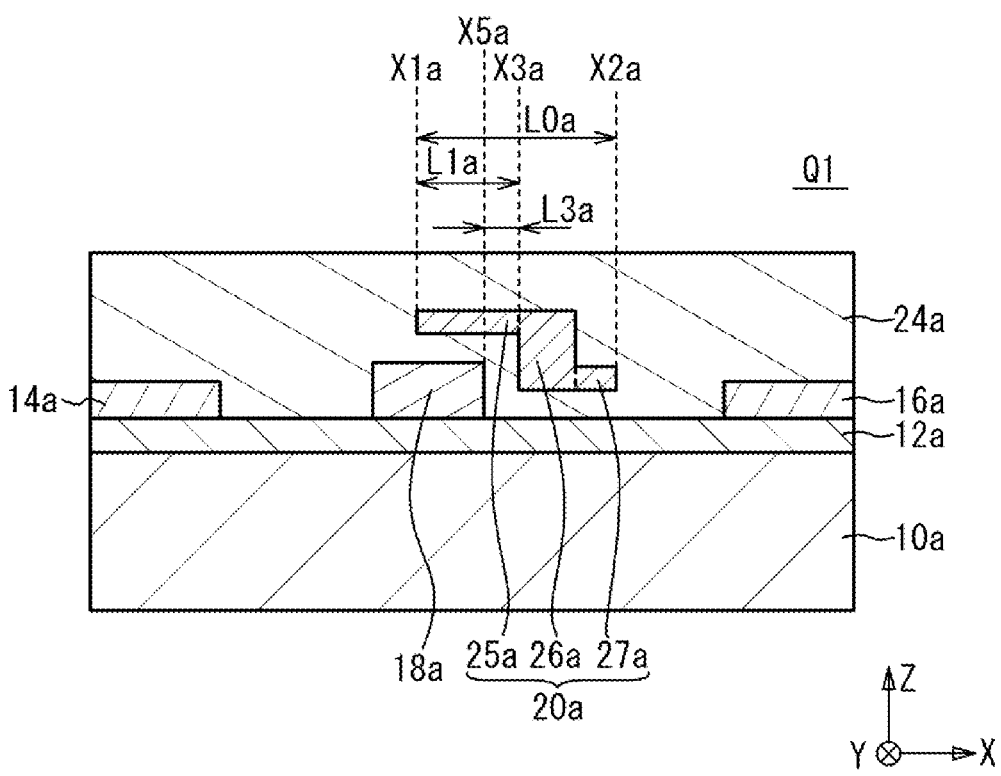
FIGS. 16A and 16B are cross-sectional views of FETs Q1 and Q2 according to a second variation of the second embodiment, respectively.
Figure 16B:
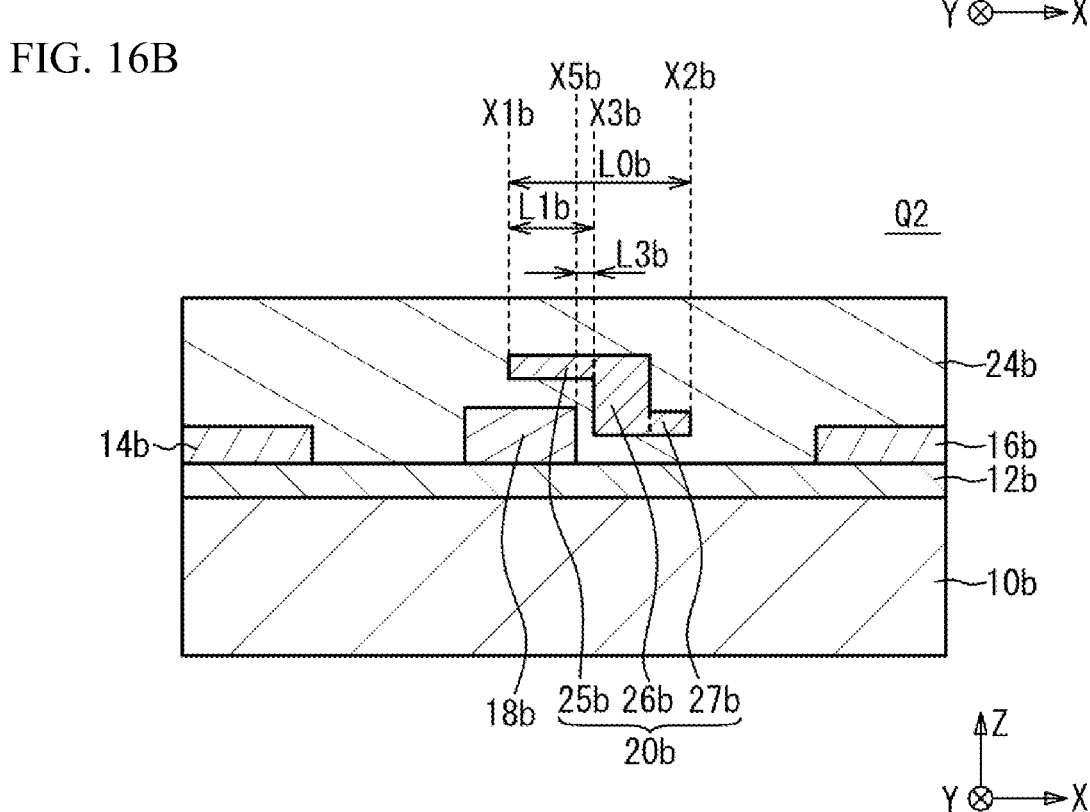

FIGS. 16A and 16B are cross-sectional views of the FETs Q1 and Q2 according to a second variation of the second embodiment, respectively. As illustrated in FIGS. 16A and 16B, a distance L3b between the gate electrode 18b and the wall portion 26b in the FET Q2 is smaller than a distance L3a between the gate electrode 18a and the wall portion 26a in the FET Q1. Thereby, the length L1b of the top portion 25b in the FET Q2 is smaller than the length L1a of the top portion 25a in the FET Q1, and the length L0b of the source wall 20b in the FET Q2 is smaller than the length L0a of the source wall 20a in the FET Q1. Other configurations are the same as those of FIGS. 14A and 14B of the second embodiment, and description thereof is omitted. In the second variation of the second embodiment, as illustrated in FIGS. 13A and 13B, the Cds2 of the FET Q2 becomes smaller than the Cds1 of the FET Q1. The Cgd1 of the FET Q1 becomes smaller than the Cgd2 of the FET Q2. Therefore, the AM-PM characteristic of the amplifier circuit can be improved.

Third Variation of Second Embodiment

Figure 17A:
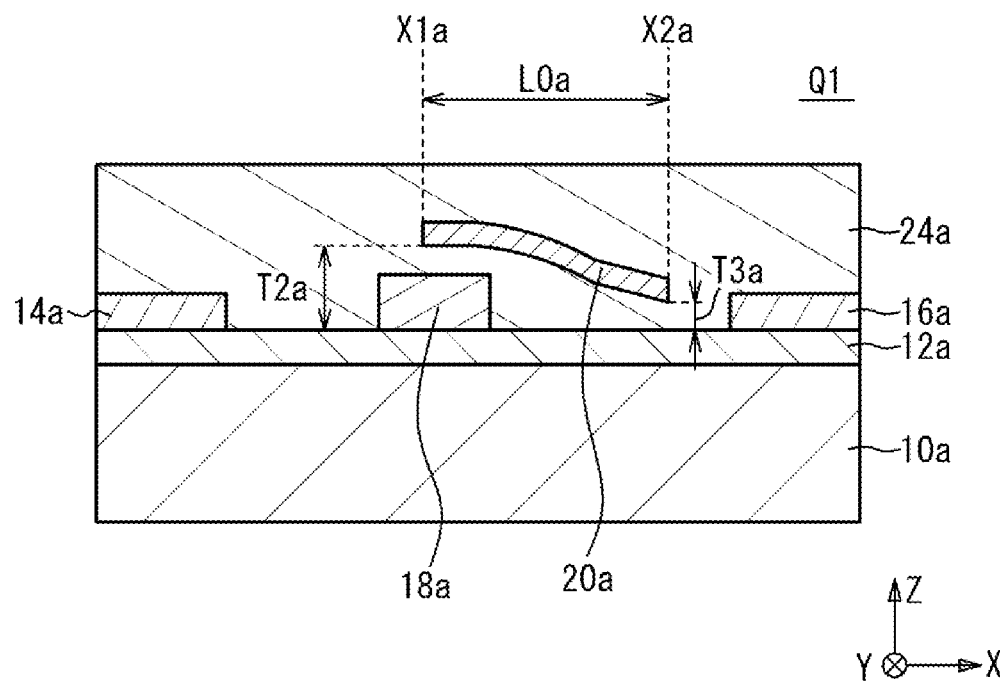
FIGS. 17A and 17B are cross-sectional views of FETs Q1 and Q2 according to a third variation of the second embodiment, respectively.
Figure 17B:
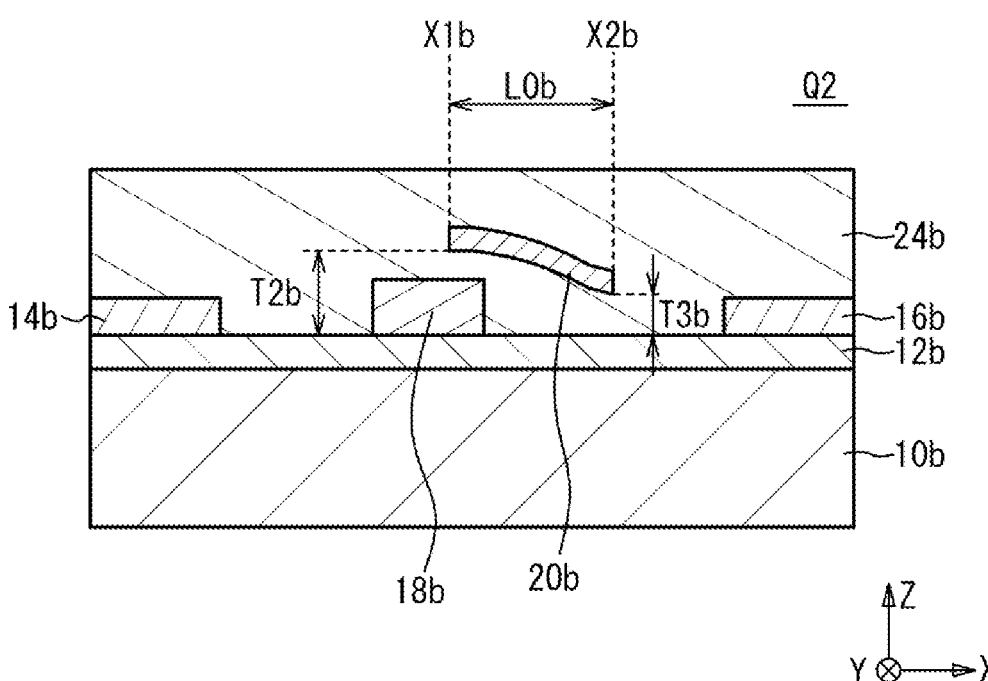

FIGS. 17A and 17B are cross-sectional views of the FETs Q1 and Q2 according to a third variation of the second embodiment, respectively. As illustrated in FIGS. 17A and 17B, the position X1b of the −X end of the source wall 20b of the FET Q2 is located on the +X side from the position X1a of the −X end of the source wall 20a of the FET Q1. The position X2b of the +X end of the source wall 20b of the FET Q2 is located on the −X side from the position X2a of the +X end of the source wall 20a of the FET Q1. The length L0b of the source wall 20b of the FET Q2 is smaller than the length L0a of the source wall 20a of the FET Q1. When the length L0 of the source wall 20 is long, electric force lines between the source wall 20 and the drain electrode 16 increase, so that the Cds becomes large. On the other hand, since electric force lines between the gate electrode 18 and the drain electrode 16 are prevented by the source wall 20, the Cgd decreases. Therefore, in the third variation of the second embodiment, the Cds2 of the FETQ2 becomes smaller than the Cds1 of the FETQ1. The Cgd1 of the FET Q1 becomes smaller than the Cgd2 of the FET Q2. Therefore, the AM-PM characteristic of the amplifier circuit can be improved.

The cross-sectional shape of each of the source walls 20a and 20b may be a shape in which rectangles are overlapped, as in the second embodiment and the first and second variations thereof. As in the third variation of the second embodiment, the upper and lower surfaces of the source walls 20a and 20b may be inclined with respect to the XY plane. From the viewpoint of improving the gate-drain breakdown voltage, it is preferable that a distance T2a between the −X end of the source wall 20a and the upper surface of the semiconductor layer 12a is larger than a distance T3a between the +X end of the source wall 20a and the upper surface of the semiconductor layer 12a. A distance T2b between the −X end of the source wall 20b and the upper surface of the semiconductor layer 12b is preferably larger than a distance T3b between the +X end of the source wall 20b and the upper surface of the semiconductor layer 12b. From the viewpoint of preventing the electric force lines between the gate electrode 18 and the drain electrode 16 and reducing the Cgd, it is preferable that at least a part of the source wall 20 overlaps with at least a part of the gate electrode 18 in the plan view.

In the second embodiment and the first to the third variations thereof, the substrates 10a and 10b may be a single substrate. That is, the FET Q1 and the FET Q2 may be provided on the same chip. The FET Q1 and the FET Q2 may be provided on different chips, respectively.

Fourth Variation of Second Embodiment

Figure 18:
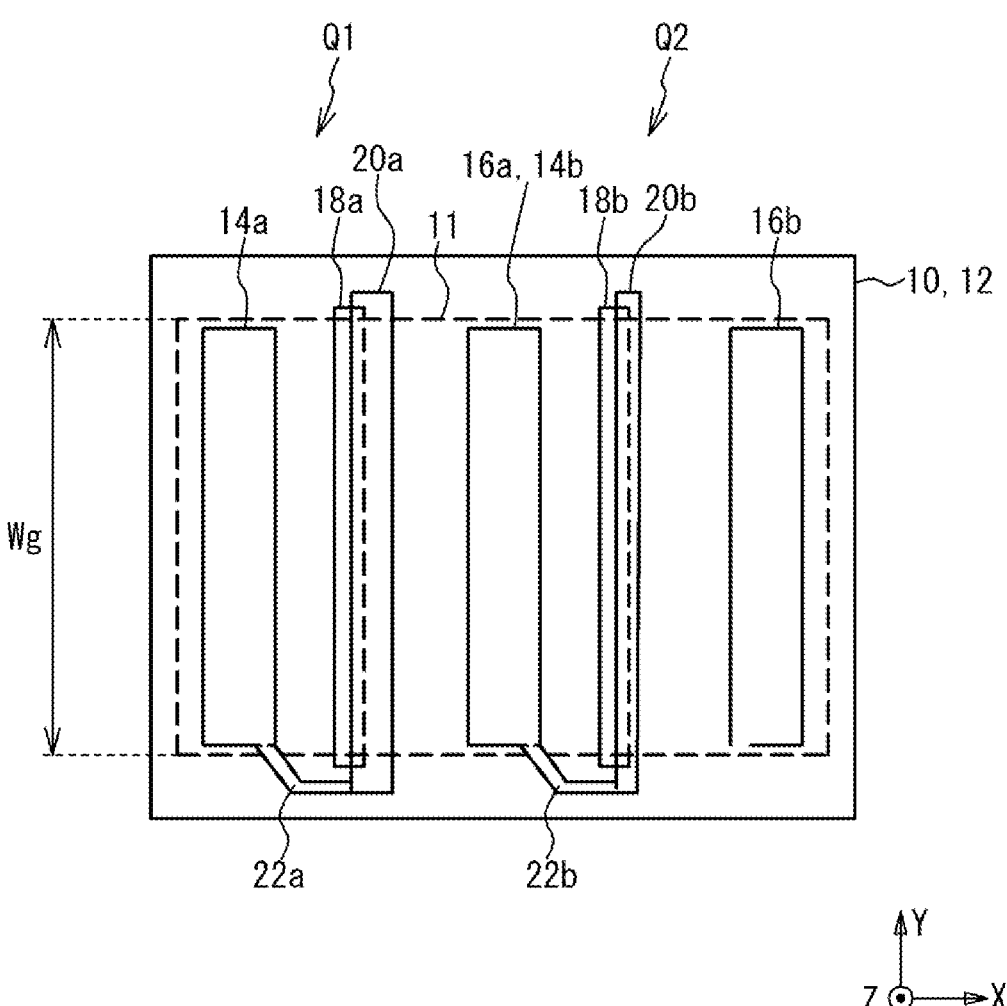
FIG. 18 is a cross-sectional view of FETs Q1 and Q2 according to a fourth variation of the second embodiment.

FIG. 18 is a cross-sectional view of the FETs Q1 and Q2 according to a fourth variation of the second embodiment. As illustrated in FIG. 18, the FETs Q1 and Q2 are provided on the same substrate 10 and the same semiconductor layer 12. The drain electrode 16a of the FET Q1 and the source electrode 14b of the FET Q2 are used as a common electrode. In the FET Q1, the gate electrode 18a between the source electrode 14a and the drain electrode 16a is provided, and the source wall 20a overlapping the gate electrode 18a is provided. A connection wiring 22a electrically connects the source electrode 14a and the source wall 20a. In the FET Q2, the gate electrode 18b between the source electrode 14b and the drain electrode 16b is provided, and the source wall 20b overlapping the gate electrode 18b is provided. A connection wiring 22b electrically connects the source electrode 14b and the source wall 20b. In the fourth variation of the second embodiment, the drain electrode 16a and the source electrode 14b are provided in common. This makes it possible to reduce a parasitic inductance between the FETs Q1 and Q2. Thus, the amplifier circuit is stabilized.

According to the second embodiment and the variations thereof, the FET Q1 includes the semiconductor layer 12a (first semiconductor layer); the source electrode 14a (first source electrode), the drain electrode 16a (first drain electrode) and the gate electrode 18a (first gate electrode) which are provided on the semiconductor layer 12a; and the source wall 20a (first source wall) provided above the semiconductor layer 12a. The source electrode 14a is connected to the ground (first reference potential) in the high-frequency manner. The high-frequency signal is input to the gate electrode 18a. At least part of the source wall 20a is provided above the semiconductor layer 12a between the gate electrode 18a and the drain electrode 16a. The FET Q2 includes the semiconductor layer 12b (second semiconductor layer); the source electrode 14b (second source electrode), the drain electrode 16b (second drain electrode) and the gate electrode 18b (second gate electrode) which are provided on the semiconductor layer 12b; and the source wall 20b (second source wall) provided above the semiconductor layer 12b. The source electrode 14b is connected to the drain electrode 16a. The gate electrode 18b is connected to the ground (second reference potential) in the high-frequency manner. The drain electrode 16b outputs the high-frequency signal. At least a part of the source wall 20b is provided above the semiconductor layer 12b between the gate electrode 18b and the drain electrode 16b. In such an amplifier circuit, the length L0b of the source wall 20b in the X-direction is smaller than the length L0a of the source wall 20a in the X-direction.

Thereby, as illustrated in FIGS. 11A to 13A and FIGS. 11B to 13B, the Cds2 of the FET Q2 becomes smaller than the Cds1 of the FET Q1, and the Cgd1 of the FET Q1 becomes smaller than the Cgd2 of the FET Q2. Therefore, the AM-PM characteristics of the FETs Q1 and Q2 can be improved, and the AM-PM characteristic of the amplifier circuit can be improved. The length L0b is preferably 0.9 times or less and more preferably 0.8 times or less of the length L0a. If the length L0b is too small, the source wall 20b does not function. Therefore, the length L0b is preferably 0.1 times or more and more preferably 0.2 times or more of the length L0a.

As illustrated in FIGS. 14A and 14B of the second embodiment and FIGS. 17A and 17B of the third variation of the second embodiment, the position X1b of the end near the source electrode 14b in the source wall 20b with respect to the gate electrode 18b is located closer to the drain electrode 16b than the position X1a of the end near the source electrode 14A in the source wall 20a with respect to the gate electrode 18a. Thereby, the Cds2 of the FET Q2 becomes smaller than the Cds1 of the FET Q1, and the Cgd1 of the FET Q1 becomes smaller than the Cgd2 of the FET Q2. Therefore, the AM-PM characteristic of the amplifier circuit 50 can be improved. A difference between the position X1b with respect to the gate electrode 18b and the position X1a with respect to the gate electrode 18a is preferably $0.1 \times Lg$ or more, and more preferably $0.2 \times Lg$ or more.

As illustrated in FIGS. 15A to 17B of the first to the third variations of the second embodiment, the position X2b of the end near the drain electrode 16b in the source wall 20b with respect to the gate electrode 18b is located closer to the source electrode 14b than the position X2a of the end near the drain electrode 16a in the source wall 20a with respect to the gate electrode 18a. Thereby, the Cds2 of the FET Q2 becomes smaller than the Cds1 of the FET Q1, and the Cgd1 of the FET Q1 becomes smaller than the Cgd2 of the FET Q2. Therefore, the AM-PM characteristic of the amplifier circuit 50 can be improved. A difference between the position X2b with respect to the gate electrode 18b and the position X2a with respect to the gate electrode 18a is preferably $0.1 \times Lg$ or more, and more preferably $0.2 \times Lg$ or more.

As illustrated in FIGS. 14A to 17B of the second embodiment and the variations thereof, at least the part of the source wall 20b overlaps with at least the part of the gate electrode 18b when viewed from a thickness direction of the semiconductor layer 12b. Thereby, the Cds2 of the FET Q2 becomes small and the Cgd2 becomes large. Therefore, the AM-PM characteristic of the amplifier circuit 50 can be improved.

The source wall 20a and the source electrode 14a have the same potential, and the source wall 20b and the source electrode 14b have the same potential. Thereby, the Cds2 of the FET Q2 becomes smaller than the Cds1 of the FET Q1, and the Cgd1 of the FET Q1 becomes smaller than the Cgd2 of the FET Q2. Therefore, the AM-PM characteristic of the amplifier circuit 50 can be improved. It should be noted that the same potential (or substantially the same potential) means the same potential to an extent that allows a voltage drop due to the resistance of the conductive layers of the connection wirings 22a and 22b and the like.

As illustrated in FIG. 18 of the fourth variation of the second embodiment, the FETs Q1 and Q2 are provided on the same substrate 10. The drain electrode 16a and the source electrode 14b are provided as a common electrode. Thereby, the parasitic inductance between the FETs Q1 and Q2 can be suppressed. Therefore, the amplifier circuit can operate stably.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. An amplifier circuit comprising:
a first FET including:
a first semiconductor layer;
a first source electrode provided on the first semiconductor layer and connected to a first reference potential in a high frequency manner;
a first gate electrode provided on the first semiconductor layer and inputting a high frequency signal;
a first drain electrode provided on the first semiconductor layer; and
a first source wall having at least a part thereof provided above the first semiconductor layer between the first gate electrode and the first drain electrode; and
a second FET including:
a second semiconductor layer;
a second source electrode provided on the second semiconductor layer and electrically connected to the first drain electrode;
a second gate electrode provided on the second semiconductor layer and connected to a second reference potential in the high frequency manner;
a second drain electrode provided on the second semiconductor layer and outputting a high frequency signal; and
a second source wall having at least a part thereof provided above the second semiconductor layer between the second gate electrode and the second drain electrode;
wherein a length of the second source wall in a direction in which the second source electrode and the second drain electrode are arranged is smaller than a length of the first source wall in a direction in which the first source electrode and the first drain electrode are arranged,
wherein the first source wall comprises a first top portion, a first wall portion, and a first bottom portion, the first top portion is connected to an upper area of the first wall portion and the first bottom portion is connected to a lower area of the first wall portion, and
wherein the second source wall comprises a second top portion, a second wall portion, and a second bottom portion, the second top portion is connected to an upper area of the second wall portion and the second bottom portion is connected to a lower area of the second wall portion.

2. The amplifier circuit according to claim 1, wherein a position of an end near the second source electrode in the second source wall with respect to the second gate electrode is located closer to the second drain electrode than a position of an end near the first source electrode in the first source wall with respect to the first gate electrode.

3. The amplifier circuit according to claim 1, wherein a position of an end near the second drain electrode in the second source wall with respect to the second gate electrode is located closer to the second source electrode than a position of an end near the first drain electrode in the first source wall with respect to the first gate electrode.

4. The amplifier circuit according to claim 1, wherein at least a part of the second source wall overlaps with at least a part of the second gate electrode when viewed from a thickness direction of the second semiconductor layer.

5. The amplifier circuit according to claim 1, wherein the first source wall and the first source electrode have a same potential as each other, and the second source wall and the second source electrode have a same potential as each other.

6. The amplifier circuit according to claim 1, wherein the first semiconductor layer and the second semiconductor layer are provided on a same substrate, and the first drain electrode and the second source electrode are provided as a common electrode.

7. The amplifier circuit according to claim 1, wherein the second top portion is smaller than the first top portion.

8. The amplifier circuit according to claim 1, wherein the second bottom portion is smaller than the first bottom portion.

9. The amplifier circuit according to claim 1, wherein the length of the second source wall is 0.9 times or less smaller than the length of the first source wall.

10. The amplifier circuit according to claim 1, wherein a drain source capacitance per unit gate width in the second FET is smaller than a drain source capacitance per unit gate width in the first FET.

11. The amplifier circuit according to claim 10, wherein a gate-drain capacitance per unit gate width in the second FET is larger than a gate-drain capacitance per unit gate width in the first FET.

12. The amplifier circuit according to claim 1, wherein a first lower surface of the first top portion is located above the first gate electrode, and a second lower surface of the second top portion is located above the second gate electrode.

13. The amplifier circuit according to claim 1, wherein the first wall portion is located between the first gate electrode and the first drain electrode, and the second wall portion is located between the second gate electrode and the second drain electrode.

14. The amplifier circuit according to claim 1, wherein a first distance between the second gate electrode and the second wall portion is smaller than a second distance between the first gate electrode and the first wall portion.

15. The amplifier circuit according to claim 1, wherein the first FET and the second FET are GaN HEMTs.

16. The amplifier circuit according to claim 1, wherein at least a part of the first source wall overlaps with at least a part of the first gate electrode when viewed from a thickness direction of the first semiconductor layer.

17. The amplifier circuit according to claim 1, wherein the length of the second source wall is 0.8 times or less of the length of the first source wall.

18. The amplifier circuit according to claim 1, wherein the length of the second source wall is 0.1 times or more of the length of the first source wall.

* * * * *